US006521823B2

(12) United States Patent
Kubota et al.

(10) Patent No.: US 6,521,823 B2
(45) Date of Patent: Feb. 18, 2003

(54) SOLAR CELL AND METHOD OF FABRICATING THE SAME

(75) Inventors: Yuichi Kubota, Chiba (JP); Kazuo Nishi, Yamanashi (JP)

(73) Assignees: TDK Corporation, Tokyo (JP); Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/746,564

(22) Filed: Dec. 21, 2000

(65) Prior Publication Data

US 2001/0015221 A1 Aug. 23, 2001

(30) Foreign Application Priority Data

Dec. 22, 1999 (JP) ............................. 11-363800

(51) Int. Cl.$^7$ ............................................. H01L 31/052
(52) U.S. Cl. ................... 136/246; 136/244; 136/251; 136/252; 136/256; 136/259; 136/257; 438/64; 438/65; 438/66; 438/69; 438/70; 438/72; 438/80; 438/71; 438/98; 257/436; 257/437
(58) Field of Search .................. 136/244, 251, 136/252, 256, 259, 257, 246; 438/64, 65, 66, 69, 70, 72, 80, 71, 98; 257/436, 437

(56) References Cited

U.S. PATENT DOCUMENTS

| | | | |
|---|---|---|---|
| 4,038,104 A | | 7/1977 | Tsutomu |
| 5,348,589 A | * | 9/1994 | Arai et al. .................. 136/244 |
| 5,453,134 A | | 9/1995 | Arai et al. |
| 5,637,156 A | | 6/1997 | Kubota et al. |
| 5,994,642 A | | 11/1999 | Higuchi et al. |
| 6,051,778 A | * | 4/2000 | Ichinose et al. ............ 136/256 |
| 6,168,968 B1 | * | 1/2001 | Umemoto et al. ............ 438/96 |
| 6,268,558 B1 | * | 7/2001 | Kubota ........................ 136/244 |
| 6,384,318 B1 | * | 5/2002 | Nomura ...................... 136/256 |
| 6,444,899 B2 | * | 9/2002 | Kubota et al. .............. 136/256 |
| 2001/0017153 A1 | * | 8/2001 | Kubota et al. .............. 136/256 |

FOREIGN PATENT DOCUMENTS

| | | |
|---|---|---|
| EP | 0 986 109 A1 | 3/2000 |
| JP | 01-025235 | 5/1989 |
| JP | 01-168073 | 7/1989 |
| JP | 02-094575 | 4/1990 |
| JP | 05-029641 | 2/1993 |
| JP | 05-183177 | 7/1993 |
| JP | 6-45628 A * | 2/1994 |
| JP | 08-231675 | 9/1996 |
| JP | 2698401 | 9/1997 |
| JP | 11-121779 A * | 4/1999 |
| JP | 11-330506 | 11/1999 |
| JP | 11-340490 | 12/1999 |
| WO | WO 99/49522 A1 * | 9/1999 |

OTHER PUBLICATIONS

Kubota, et al., "Solar Cell and Method of Fabricating the Same", U.S. patent application Ser. No. 09/746,566, filed Dec. 21, 2000.

\* cited by examiner

*Primary Examiner*—Alan Diamond
(74) *Attorney, Agent, or Firm*—Fish & Richardson P.C.

(57) ABSTRACT

In a solar cell, there is provided a method of improving external appearance quality by lowering surface reflection and by making a change of a color tone at openings and portions between electrode patterns, resulting from integrating working, inconspicuous. In the solar cell, at the openings and the portions between the electrode patterns resulting from the integrating working, when seen from a light incident side, since the number of laminated films or the materials are different, colors in appearance become different among the respective regions. In the present invention, an insulating resin layer, a rear electrode layer, a sealing resin layer, and the like are colored by containing pigments or the like so that the colors thereof become similar to the color of a region of a structural portion occupying the great part of the solar cell. The coloring, together with the unevenness of the surface passivation layer, can make the change of the color tone at the openings and the portions between the electrode patterns resulting from the integrating working inconspicuous.

12 Claims, 8 Drawing Sheets

SOLAR CELL AND METHOD OF FABRICATING THE SAME

BACKGROUND OF THE INVENTION

1. Field of the Invention

The present invention relates to a structure of a solar cell well suited for a power source of electric instrument with low power consumption, such as a calculator and a watch, and also relates to a method of fabricating the same.

2. Description of the Related Art

A solar cell is used as a sunlight electrical generating system, which is installed outdoors, or is used as a power source of an electric instrument with low power consumption, such as a calculator, a radio, and a watch. In the latter use, like a wrist watch, there is a case where importance is attached to not only the function but also to its external design. Accordingly, a mounting method of the solar cell is also devised, and it is directly used for a face of the watch, or is installed under a semitranslucent face of the watch to make it unnoticeable.

In most of solar cells used for electric instruments or the like, glass, stainless, organic resin material or the like is used for a substrate, and a photoelectric conversion layer is formed thereon with a thin film of amorphous semiconductor, microcrystalline semiconductor, or chalcopalide-based (or II-VI group) compound semiconductor. Especially, the solar cell using an organic resin material for the substrate is thin and lightweight, and has an excellent shock resistance so that it is not cracked even if it is dropped. Accordingly, it is suitable for mounting to a portable product, such as a card type calculator and a wrist watch. In the case where the solar cell is installed in a small electric instrument such as a wrist watch and a card type calculator, for the purpose of simplifying the layout of wiring lines, it is considered to be desirable that an external connection terminal is placed at a side opposite to a light incident surface of the solar cell.

There is a best known technique for forming a photoelectric conversion layer with a non-monocrystalline semiconductor material, such as amorphous silicon and microcrystalline silicon, fabricated by a plasma CVD method. As means for increasing the productivity of the solar cell and decreasing the manufacturing costs, there is known a method in which while a flexible substrate wound into a roll shape is rewound around another roll, respective unit operations such as film formation, printing, and laser working are carried out during the process by in-line processing to continuously make treatment. This method is called a roll-to-roll method.

In a non-monocrystalline semiconductor layer formed by the plasma CVD method, a substrate is heated to 100° C. or more in view of the balance between acquisition of excellent photoelectric conversion characteristics and film formation speed. However, when an organic resin film of polyester or the like is heated, oligomer (polymer in which the repetition number of structural units is about 2 to 20) is apt to be produced. Further, since it is generally an equilibrium reaction, there is a tendency in that the amount is increased as the temperature is raised.

In a solar cell installed in an electric equipment, attention is paid also to its color tone, surface shape, and the like. Although a solar cell having a structure in which light is entered onto the solar cell through a substrate has a flat surface in its external appearance, surface reflection and a color tone at openings and portions between electrode patterns resulting from integrating working become different and conspicuous. Besides, oligomer deposited on the light incident surface has low adhesion force, and is apt to be dropped off. Therefore, it can be relatively easily removed. However, it pollutes the instrument incorporating the solar cell.

SUMMARY OF THE INVENTION

An object of the present invention is to provide a solar cell in which surface reflection is lowered, and a change of a color tone at openings and portions between electrode patterns resulting from integrating working is made inconspicuous, with the result that external appearance quality is improved.

In order to achieve the above-mentioned object, according to an aspect of the present invention, in a solar cell in which light is entered from a side of a translucent substrate, a transparent electrode layer, a photoelectric conversion layer, and a rear electrode layer are formed on one surface of a transparent organic resin substrate, a surface passivation layer made of an organic resin layer is formed on the other surface, and the surface passivation layer includes a filler.

In the solar cell, the surface passivation layer includes at least one selected from the group consisting of a white filler and a colorless filler.

In the solar cell, the surface passivation layer comprises at least one selected from the group consisting of phenoxy resin and thermally hardened resin of the phenoxy resin.

In the solar cell, nonaromatic isocyanate or melamine resin making a thermal crosslinking reaction with a hydroxyl group of the phenoxy resin is used as a crosslinking agent so as to thermally harden the phenoxy resin.

According to another aspect of the present invention, a solar cell includes a transparent electrode layer, a photoelectric conversion layer, and a rear electrode layer, which are formed on one surface of a transparent organic resin substrate, a first opening filled with an insulating resin and a second opening filled with a same conductive material as the rear electrode layer, which are formed in the transparent electrode layer and the photoelectric conversion layer, and a surface passivation layer made of an organic resin layer and formed on the other surface of the organic resin substrate, wherein the surface passivation layer includes a filler.

In the solar cell, the surface passivation layer includes at least one selected from the group consisting of a white filler and a colorless filler.

In the solar cell, the surface passivation layer comprises at least one selected from the group consisting of phenoxy resin and thermally hardened resin of the phenoxy resin.

In the solar cell, nonaromatic isocyanate or melamine resin making a thermal crosslinking reaction with a hydroxyl group of the phenoxy resin is used as a crosslinking agent so as to thermally harden the phenoxy resin.

The surface passivation layer having a main ingredient of phenoxy resin as disclosed in Japanese Patent Application Laid-open No. Hei 8-231675 and/or phenoxy resin added with nonaromatic functional isocyanate or melamine resin, is formed by a screen printing method or a roll coater method to obtain a thickness of 3 to 10 $\mu$m. The surface passivation layer includes a filler, thereby forming irregularities of about 3 to 8 $\mu$m, and gives an effect of lowering surface reflection.

According to still another aspect of the present invention, a method of fabricating a solar cell includes a first step of forming a transparent electrode layer on a transparent organic resin substrate, a second step of forming a photoelectric conversion layer on the transparent electrode layer, a third step of forming a first opening and a second opening reaching the substrate in the transparent electrode layer and the photoelectric conversion layer, a fourth step of forming an insulating layer covering the first opening and an upper end portion of the opening, a fifth step of forming a conductive layer covering the photoelectric conversion layer, the insulating layer, the second opening and an upper end portion of the opening, and a sixth step of forming a sealing resin layer on the photoelectric conversion layer and the conductive layer, the method further including a step of forming a surface passivation layer which may be carried out between any steps if they are subsequent to the second step.

In the method of fabricating the solar cell, the surface passivation layer includes a filler in addition to at least one selected from the group consisting of phenoxy resin and thermosetting phenoxy resin as a matrix resin component, and the surface passivation layer has a certain degree of an optical diffusibility in addition to an optical transparency.

In the method of fabricating the solar cell, nonaromatic isocyanate or melamine resin making a thermal crosslinking reaction with a hydroxyl group of the phenoxy resin is used as a crosslinking agent so as to thermally harden the phenoxy resin.

According to still another aspect of the present invention, a method of fabricating a solar cell includes a first step of forming a transparent electrode layer on a transparent organic resin substrate, a second step of forming a photoelectric conversion layer on the transparent electrode layer, a third step of forming a first conductive layer of a predetermined pattern on the photoelectric conversion layer, a fourth step of forming a first opening and a second opening reaching the substrate in the transparent electrode layer and the photoelectric conversion layer, a fifth step of forming an insulating layer covering the first opening and an upper end portion of the opening, a sixth step of forming a second conductive layer covering the photoelectric conversion layer, the insulating layer, the second opening and an upper end portion of the opening, and a seventh step of forming a sealing resin layer on the photoelectric conversion layer and the conductive layer, the method further including a step of forming a surface passivation layer after the second step.

In the method of fabricating the solar cell, the surface passivation layer includes a filler in addition to at least one selected from the group consisting of phenoxy resin and thermosetting phenoxy resin as a matrix resin component, and the surface passivation layer has a certain degree of an optical diffusibility in addition to an optical transparency.

In the method of fabricating the solar cell, nonaromatic isocyanate or melamine resin making a thermal crosslinking reaction with a hydroxyl group of the phenoxy resin is used as a crosslinking agent so as to thermally harden the phenoxy resin.

DETAILED DESCRIPTION OF THE PREFERRED EMBODIMENTS

[Embodiment 1]

Figure 1A:
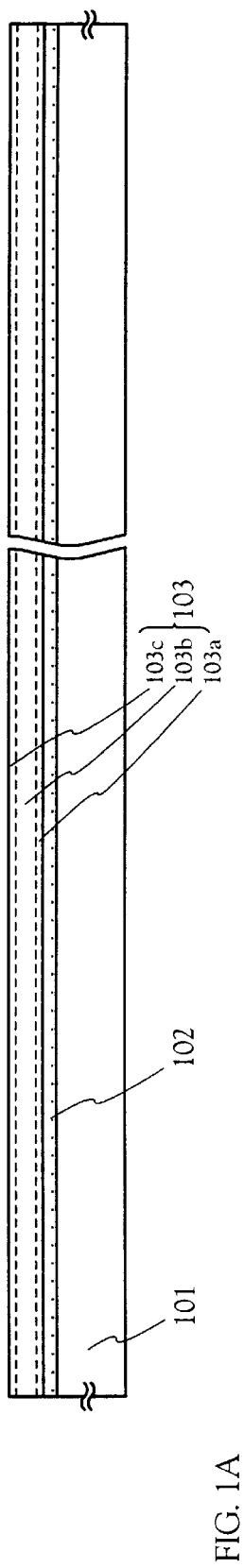
FIGS. 1A to 1C are sectional views for explaining a fabricating process of a solar cell of Embodiment 1.

An embodiment of the present invention will be described with reference to FIGS. 1A to 1C and FIG. 2. In FIG. 1A, a translucent organic resin material, such as polyethylene terephthalate (PET), polyethylene naphthalate (PEN), or polyethersulfone (PES), is used for a substrate 101. For the purpose of fabricating an integrated solar cell in which an organic resin material is used for a substrate and a plurality of unit cells are connected in series with each other on the same substrate, a technique disclosed in, for example, Japanese Patent Application Laid-open No. Hei 5-183177 can be preferably used. In this embodiment, the solar cell was fabricated using the method disclosed in the publication. Of course, other commercially available soda-lime glass or alkali-free glass can also be applied.

A sheet-like substrate of a suitable size may be used as the substrate, or as described before, on the assumption that the process is carried out by the roll-to-roll method, a substrate wound into a roll shape may be used. In the case where the roll-to-roll method is applied, an organic resin film substrate having a thickness of 50 to 100 $\mu$m is used.

The solar cell fabricated in this embodiment has such a structure that light is entered on the surface of a substrate opposite to a surface on which a photoelectric conversion layer is formed, and a transparent electrode layer 102 is formed on the substrate 101. The transparent electrode 102 is formed of indium tin oxide alloy (ITO), zinc oxide (ZnO), tin oxide ($SnO_2$), ITO-ZnO alloy, or the like to a thickness of 40 to 200 nm (preferably 50 to 100 nm). However, since the continuously usable maximum temperature of the foregoing organic resin material is 200° C. or less, a sputtering method, a vacuum evaporation method or the like is used for the formation of the transparent electrode layer 102, and a coating film is formed while the substrate temperature at the film formation is limited within a range of from room temperature to about 100° C. Detailed forming conditions may be suitably determined by an operator to obtain a sheet resistance of 20 to 200 $\Omega/\square$ in the above film thickness.

Since an ITO film having low resistance can be easily formed by the sputtering method, it is suitable for the case where an organic resin substrate is used. However, when a semiconductor layer is formed thereon, since the ITO film is exposed to a plasma atmosphere containing hydrogen, the film is reduced and becomes opaque. In order to prevent this, a $SnO_2$ film or a ZnO film is formed on the ITO film. The ZnO (ZnO:Ga) film containing gallium (Ga) of 1 to 10 wt % has high transmittance and is a material suitable to be laminated on the ITO film. As an example of the combination, when the ITO film is formed to a thickness of 50 to 60 nm, and the ZnO:Ga film with a thickness of 25 nm is formed thereon, it is possible to prevent transparency from being lost, and an excellent light transmitting property can be obtained. In this lamination film, a sheet resistance of 120 to 150 Ω/□ can be obtained.

A non-monocrystalline semiconductor film formed by using a plasma CVD method is used for a photoelectric conversion layer 103. Typically, it is a hydrogenated amorphous silicon (a-Si:H) film formed by using $SiH_4$ gas as a raw material, and in addition to this, it may be formed of a hydrogenated amorphous silicon germanium (a-SiGe:H) film, a hydrogenated amorphous silicon carbon (a-SiC:H) film, a hydrogenated microcrystalline silicon (μc-Si:H) film, or the like. Although the photoelectric conversion layer is formed of a pin junction, p-type and n-type layers in which valence electron control is made, may be formed by using a-Si:H or μc-Si:H added with an impurity element such as boron or phosphorus. Especially, for the purpose of lowering light absorption loss or forming excellent ohmic contact with the transparent electrode or the rear electrode, μc-Si:H is suitable.

Although forming conditions of such a photoelectric conversion layer may be suitably determined, for the purpose of obtaining an excellent photoelectric conversion characteristic, the substrate temperature at the film formation is set to 100 to 200° C. With respect to the surface on which the photoelectric conversion layer is formed, since the transparent electrode layer is already formed on the surface of the substrate, it is possible to prevent oligomer of the substrate resin from being discharged. However, oligomer is discharged at the opposite surface.

FIG. 1A shows a state where the photoelectric conversion layer 103 is made of a laminate of a p-type layer 103a, an i-type layer 103b, and an n-type layer 103c from the side of the transparent electrode layer 102, and the thicknesses of the respective layers are 10 to 20 nm for the p-type layer, 200 to 1000 nm for the i-type layer, and 20 to 60 nm for the n-type layer. When the pin junction is formed of such non-monocrystalline silicon material, an open circuit voltage of about 0.4 to 1 V can be obtained. If this pin junction is made one unit and a plurality of such units are laminated to form a stack type structure, the open circuit voltage can also be raised.

Figure 1B:
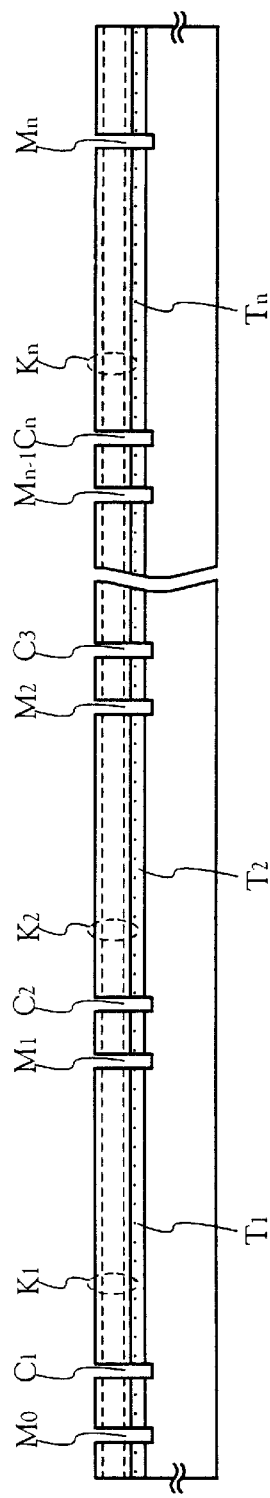

As shown in FIG. 1B, in order to form a plurality of unit cells on the same substrate, openings $M_0$ to $M_n$ and $C_1$ to $C_n$ reaching the transparent electrode layer 102 from the photoelectric conversion layer 103 are formed by a laser working method. The openings $M_0$ to $M_n$ are openings for insulation separation and are provided to form the unit cells. The openings $C_1$ to $C_n$ are openings for forming connection between the transparent electrode and the rear electrode. Although the kind of a laser used for the laser working method is not restricted, a Nd-YAG laser, an excimer laser, or the like is used. At all events, by performing the laser working in the state where the transparent electrode layer 102 and the photoelectric conversion layer 103 are laminated, it is possible to prevent the transparent electrode layer from peeling off the substrate at the working.

Figure 1C:
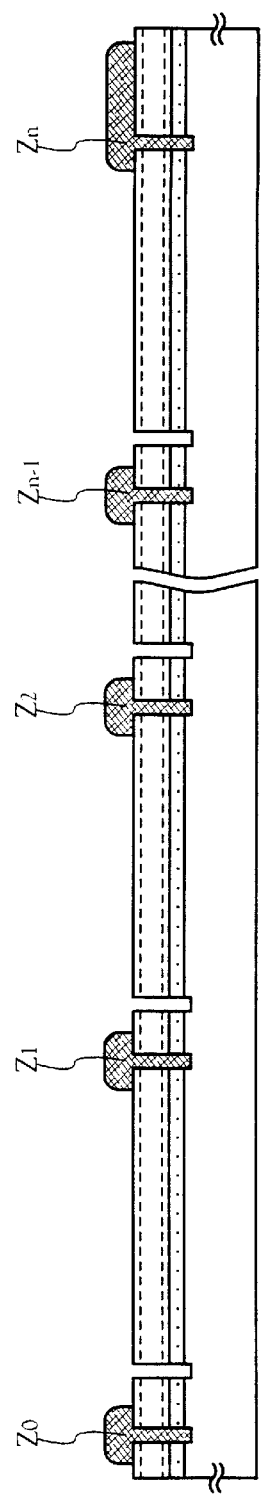

In this way, the transparent electrode layer 102 is divided into $T_1$ to $T_n$, and the photoelectric conversion layer is divided into $K_1$ to $K_n$. Then, as shown in FIG. 1C, insulating resin layers $Z_0$ to $Z_n$ filling the openings $M_0$ to $M_n$ and further covering the upper end portions are formed.

For the purpose of forming the insulating resin layers $Z_0$ to $Z_n$ by a screen printing method, the following insulating resin material was prepared.

phenoxy resin (manufactured by UCC Inc.: PKHH Mn=15,400), 20 pts. by weight cyclohexane, 40 pts. by weight Isophorone, 30 pts. by weight high resistance carbon black (manufactured by Degussa AG Inc.: average particle diameter of 25 nm), 4 pts. by weight Aerosil (manufactured by Degussa AG Inc.: average particle diameter of 15 nm), 10 pts. by weight dispersing agent (oleic acid), 3 pts. by weight antifoaming agent (manufactured by Toshiba Silicone Co., Ltd.: TSA-720), 1 pts. by weight leveling agent (manufactured by Sin-etsu Silicone Co., Ltd.: KS-66), 1 pts. by weight First, among the above raw materials, phenoxy resin was completely dissolved in a mixture solvent of cyclohexane/Isophorone, and was dispersed for 48 hours by a ball mill made of zirconium, together with carbon black, Aerosil and dispersing agent. Next, the antifoaming agent and leveling agent were added and were further mixed for two hours. Next, thermal crosslinking reactive component resins described below were added thereto.

n-butylated melamine resin (manufactured by Mitsui Toatsu Chemical Co., Ltd.: U-VAN 21R: weight average molecular weight of about 7000), 5 pts. by weight hardening accelerator (manufactured by Mitsui Toatsu Chemical Co., Ltd.: Catalyst 6000), 0.03 pts. by weight These were further mixed and dispersed for 20 minutes to obtain an insulating resin composite for a passivation film.

The obtained insulating resin composite ink was used, and the insulating film was formed by using the screen printing method. After coating, thermal hardening was conducted in an oven for 20 minutes at 160° C. to obtain the insulating resin layers $Z_0$ to $Z_n$.

Figure 2:
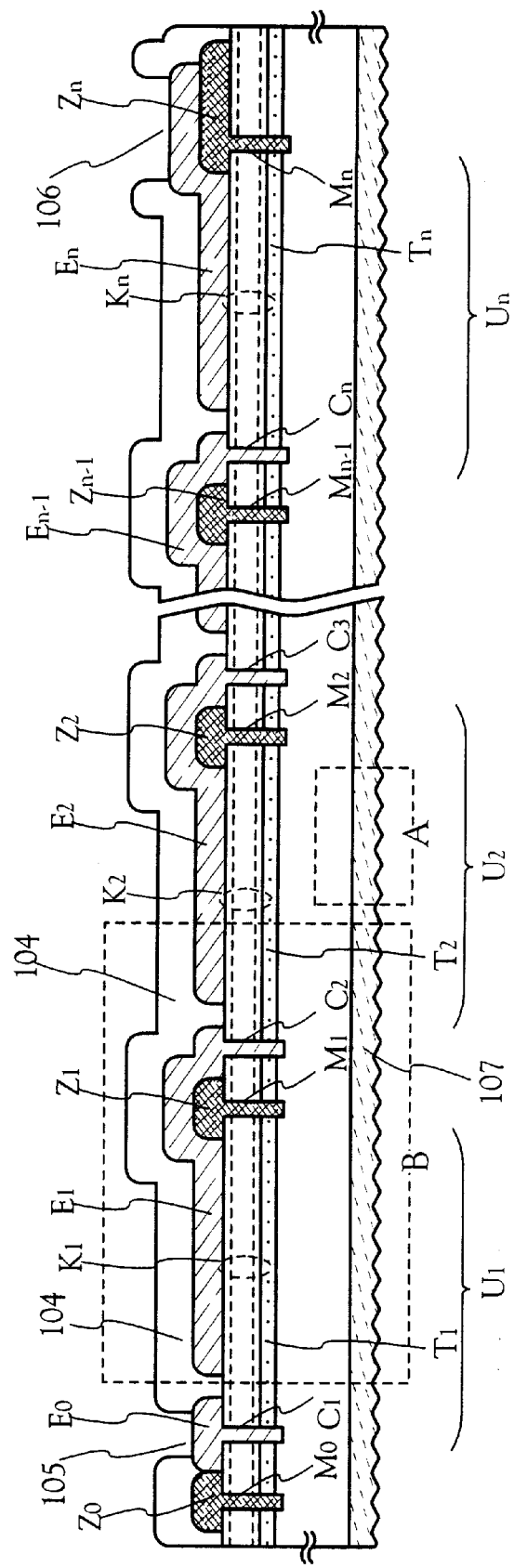
FIG. 2 is a sectional view showing a state where the solar cell is completed of Embodiment 1.

Next, for the purpose of forming rear electrode layers $E_0$ to $E_n$ as shown in FIG. 2 by the screen printing method, the following were prepared for ink to be used.

graphite powder CPB-5000 (manufactured by Chuetsu Graphite Industry Co., Ltd.), 9 pts. by weight high conductive black #3950 (16 nm) manufactured by Mitsubishi Chemical Corp., 6 pts. by weight oleic acid (dispersing agent) of 0.5 pts. by weight Isophorone (solvent), 20 pts. by weight These were put into a ball mill to crush them for 24 hours, and obtained finer particles. Next, 75 pts. by weight of 20 wt % γ-butyrolactone lacquer of saturated polyester resin having the following contents were put into this.

VYLON 220 (OH value of about 55 KOHmg/g) manufactured by Toyobo Co., Ltd., 7 pts. by weight VYLON 200 (OH value of about 5 KOHmg/g) manufactured by Toyobo Co., Ltd., 5 pts. by weight VYLON 630 (OH value of about 42 KOHmg/g) manufactured by Toyoho Co., Ltd., 3 pts. by weight γ-butyrolactone (solvent), 60 pts. by weight Then, an antifoaming agent and a leveling agent having the following contents were added thereto.

antifoaming agent (manufactured by Toshiba Silicone Co., Ltd.: TSA-720), 2 pts. by weight leveling agent (manufactured by Sin-etsu Silicone Co., Ltd.: KS-66) of 0.5 pts. by weight Further, a paste obtained after dispersion mixing by the ball mill for 24 hours was further dispersed by a three-roll mill to obtain a conductive carbon paste.

This paste was added with 5 pts. by weight of ethyl acetoacetate block body (solid content 80 wt %, NCO content 10 wt %) CORONATE 2513 (manufactured by Nippon Polyurethane Kogyo Co., Ltd.) which was obtained by blocking isocynate group of hexamethylenediisocynatebased polyisocynate of aliphatic polyfunctional isocynate by ethyl acetoacetate and by diluting it with a solvent of cellosolve acetate and xylene at one to one, mixing was sufficiently manufactured by Disper, and defoaming was sufficiently made to obtain a conductive carbon paste.

Then, the obtained conductive carbon paste was printed into a predetermined pattern by the screen printing method, and after leveling and drying, it was firmly hardened at 150° C. for 30 minutes to form the rear electrode layers $E_0$ to $E_n$ as shown in FIG. 2.

If doing so, although the rear electrode layers come in contact with the n-type layer 103c of the photoelectric conversion layer, in order to make this contact ohmic contact and further to lower the contact resistance, it is necessary that the n-type layer 103c is formed of $\mu$c-Si:H, and its thickness is made 30 to 80 nm.

The respective rear electrodes $E_1$ to $E_n$ are formed so as to be connected with the transparent electrode layers $T_1$ to $T_n$ at the openings $C_1$ to $C_n$. The same material as the rear electrode is filled in the openings $C_1$ to $C_n$, and in this way, the rear electrode $E_{n-1}$ is electrically connected to the transparent electrode $T_n$.

Finally, in order to form a sealing resin layer 104 by the printing method, as a sealing resin raw material, the following was prepared.

epoxy resin (manufactured by Yuka-Shell Epoxy K. K.: Epikote 1009, molecular weight of about 3750), 20 pts. by weight γ-butyrolactone, 40 pts. by weight Isophorone, 30 pts. by weight antifoaming agent (manufactured by Toshiba Silicone Co., Ltd.: TSA-720), 3 pts. by weight leveling agent (manufactured by Shin-etsu Silicone Co., Lt.: KS-66), 1 pts. by weight.

First, among the above raw materials, epoxy resin was completely dissolved in a mixture solvent of γ-butyrolactone/Isophorone, and was dispersed for 48 hours by a ball mill made of zirconium. Next, the antifoaming agent and the leveling agent were added and further mixed for 2 hours, and a thermal crosslinking reactive component described below was added.

butylated melamine resin (manufactured by Mitsui Chemical Corp.: U-VAN 20SE-60: molecular weight of about 3500 to 4000), 5 pts. by weight These were further mixed and dispersed for 20 minutes to obtain a transparent composite for an insulating surface protecting sealing film.

The ink of the obtained composite for the insulating surface protecting scaling film was used, and the sealing resin layer 104 was formed by using the screen printing method, and was thermally hardened at 150° C. for 30 minutes. Opening portions 105 and 106 were formed in the sealing resin layer 104 on the rear electrodes $E_0$ and $E_n$, with the result that they were connected to an external circuit substrate at these portions.

A surface passivation layer 107 is formed on a surface of the substrate 101 opposite to the side at which the photoelectric conversion layer 103 has been formed, to a thickness of 3 to 10 $\mu$m in such a manner that ultrafine powder silica Aerosil of 5 to 7% is added in phenoxy resin, a filler, a leveling agent, an antifoaming agent, and a hardening agent are added, and they are applied by a screen printing method or a roll coater method.

Figure 8:
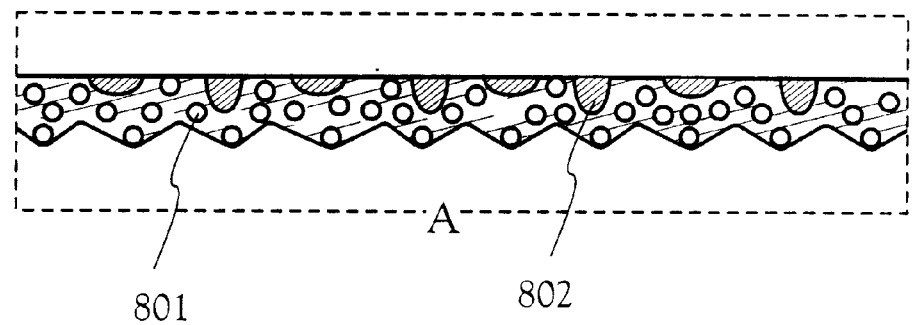
FIG. 8 is a partially enlarged view for explaining a structure of a light incident surface passivation layer of Embodiment 1.

FIG. 8 is a detailed view of a portion surrounded by a dotted line A of FIG. 2. The surface passivation layer 107 contains an inorganic filler (Aerosil) 801. When the photoelectric conversion layer is formed at the opposite surface of the PEN film base material by the plasma CVD process, there is also a case where an oligomer 802 of PEN is discharged to the surface of the PEN film base material. Although the oligomer of PEN has low adhesion force and is apt to fall off, it can be simultaneously fixed at the time of forming the surface passivation layer 107. The inorganic filler 801 and the discharged oligomer 802 form organic fillers, and an unevenness of about 3 to 8 $\mu$m is formed on the surface of the surface passivation layer 107. The surface reflection is lowered by this uneven shape, the amount of light incident on the photoelectric conversion layer is increased, and a kind of tight confinement effect that returning light of incident light reflected by the photoelectric conversion layer and the transparent electrode layer is again reflected by the contained fillers and is returned to the photoelectric conversion layer to accelerate photoelectric conversion is also obtained, so that the photoelectric conversion efficiency of the solar cell can be raised.

Figure 9A:
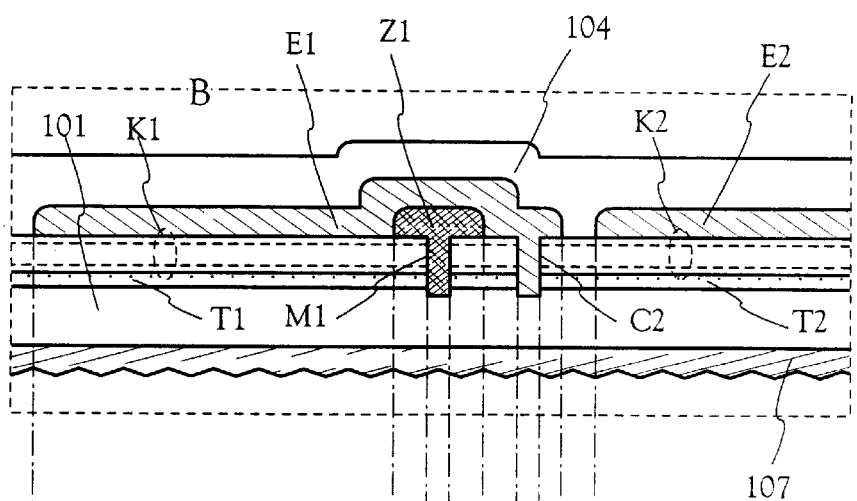
FIGS. 9A and 9B are partially enlarged view of an integrating structure of Embodiment 1.
Figure 9B:
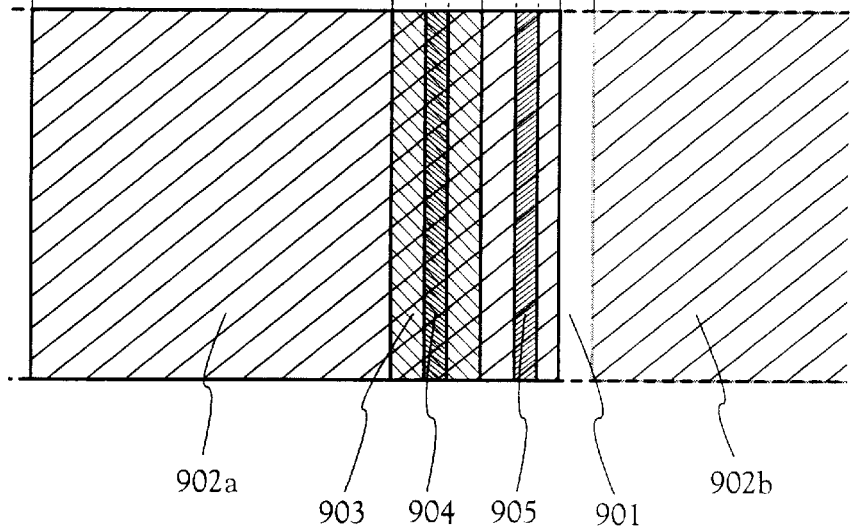

FIGS. 9A and 9B are detailed views of a portion surrounded by a dotted line B of FIG. 2. FIG. 9A is a sectional view equivalent to the portion surrounded by the dotted line B, and FIG. 9B is a plan view corresponding to the sectional view and is a plan view seen from the surface of the light incident side. In FIG. 9B, a region 901 is a region where the surface passivation layer 107, the substrate 101, the transparent electrode layer T2, and the photoelectric conversion layer K2 are formed from the light incident side. Regions 902a and 902b are respectively regions where the surface passivation layer 107, the substrate 101, the transparent electrodes T1 and T2, the photoelectric conversion layers K1 and K2, and the rear electrode layers E1 and E2 are formed from the light incident side, and the regions contribute to photoelectric conversion. A region 903 is a region where the surface passivation layer 107, the substrate 101, the transparent electrode layer T2, the photoelectric conversion layer K1, the insulating resin layer Z1, and the rear electrode layer E1 are formed from the light incident side. Since the insulating resin layer Z1 is colored brown, an influence of the rear electrode layer E1 does not appear in the external appearance. A region 904 is a portion corresponding to the opening M1. Since the opening is formed by removing the photoelectric conversion layer and the transparent electrode layer, the insulating resin layer Z1 is filled. A region 905 is a portion corresponding to the opening C2 and is filled with the rear electrode E1. Like this, when seen from the light incident side, since the number of laminated films or the materials are different, colors in appearance become different among the respective regions. Actually, since the greater part of the area of the solar cell is occupied by the structure of the region 902a, the other regions are colored by adding pigments or the like, with the result that the coloring of the other regions become similar to the region 902a.

For example, in the insulating resin layer, α-iron oxide is used for coloring of red, brown, purple, and black, high resistance carbon is used for coloring of black, titanium oxide is used for coloring of white, and so on. In the α-iron oxide, the foregoing color tones can be selected through a difference in a sintering method, and is effective in the adjustment of the color tone to the amorphous silicon layer. With respect to the color tone of the insulating resin layer, it is effective that the color tone of combination of light interference colors of the amorphous silicon layer and the transparent electrode layer is detected: by a color-difference meter to measure the luminosity (L), red (a), and blue (b) of its reflection color, a color difference ΔE is obtained through a Lab color difference display system of the luminosity (L'), red (a'), and blue (b') of the reflection light of the insulating resin ink film in which the pigments of the various color tones are fully dispersed, and color adjustment is made so that ΔE is not larger than 1.0, at least not larger than 2.0. The color difference ΔE is indicated by the following equation.

$$\Delta E = \sqrt{(L-L')^2 + (a-a')^2 + (b-b')^2} \quad \text{(EQUATION 1)}$$

The rear electrode layer is colored by a silver paste or the like, and the sealing resin 104 is colored by using Aerosil containing white to colorless silica, or the like.

In this way, coloring to the regions other than the region 902a of the greater part of the solar cell, together with the unevenness of the surface passivation layer 107, can make the color tone change at the openings and the portions between electrode patterns, resulting from integrating working, inconspicuous.

It is appropriate that the surface passivation layer 107 is formed after the photoelectric conversion layer 103 is formed, and this embodiment shows an example in which it is formed after the sealing resin layer 104 is formed. In the manner described above, the unit cell made of the transparent electrode $T_n$, the photoelectric conversion layer $K_n$, and the rear electrode layer $E_n$ is formed on the substrate 101, and the adjacent rear electrode $E_{n-1}$ is connected to the transparent electrode $T_n$ through the opening $C_n$, so that the solar cell in which n unit cells are connected in series with each other can be fabricated. The rear electrode $E_0$ is a lead-out electrode of the transparent electrode $T_1$ of the unit cell $U_1$.

In the solar cell fabricated in this embodiment, the sheet resistance of the transparent electrode layer is 120 to 150Ω/□, and that of the rear electrode layer is 30 to 80 Ω/□. Since an aluminum film suitably used for a rear electrode material of a solar cell has a sheet resistance of 1 Ω/□ or less, it is a high value as compared with this. However, like this, when the resistance values of the transparent electrode layer and the rear electrode layer are made the same level and are balanced, the resistance against electrostatic damage can be remarkably improved.

[Embodiment 2]

Figure 3A:
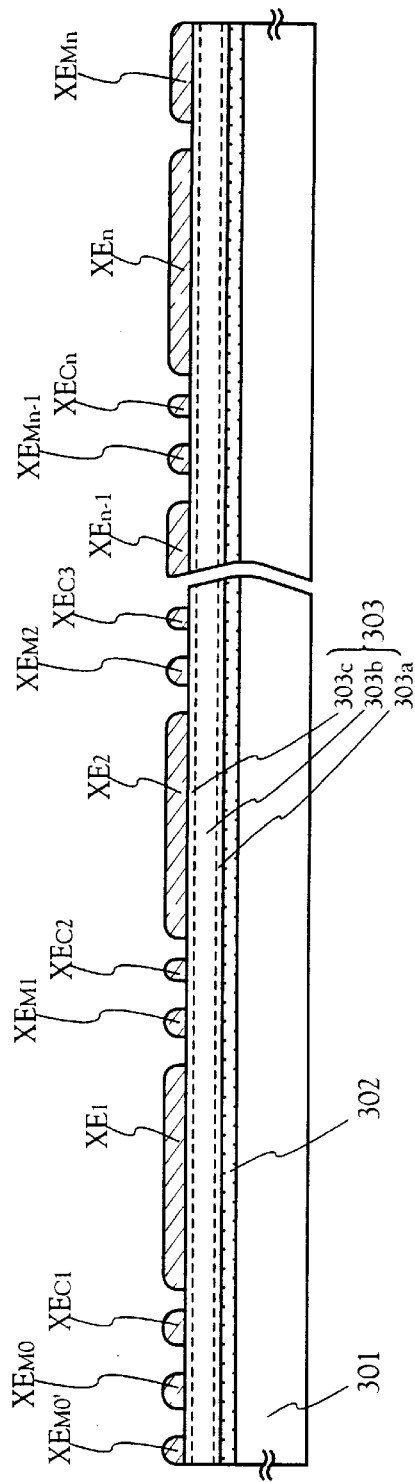
FIGS. 3A to 3C are sectional views for explaining a fabricating process of a solar cell of Embodiment 2.

Another embodiment of the present invention will be described with reference to FIGS. 3A to 3C and FIG. 4. In FIG. 3A, a substrate 301, a transparent electrode 302, and a photoelectric conversion layer 303 are formed in the same manner as the embodiment 1. Then, rear electrodes XE are formed on the photoelectric conversion layer 303 by the screen printing method like the embodiment 1.

Figure 3B:
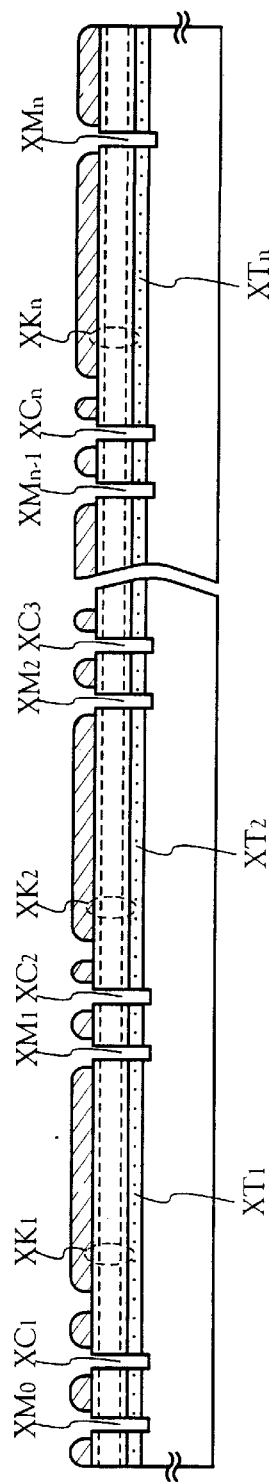

Then, as shown in FIG. 3B, openings $XM_0$ to $XM_n$ and $XC_1$ to $XC_n$ reaching the transparent electrode layer 302 from the photoelectric conversion layer 303 are formed by a laser processing method. The openings $XM_0$ to $XM_n$ are insulation separating openings for forming unit cells, and the openings $XC_1$ to $XC_n$ are for forming connection between the transparent electrode and the rear electrode.

At the laser processing, there is a case where a residue remains at the periphery of the opening. This residue is a spray of a material to be processed, and since the spray heated up to a high temperature by laser light is attached to the surface of the photoelectric conversion layer 303 to damage the film, it is originally undesirable. In order to prevent this, the rear electrode is formed in accordance with the pattern of the openings, and then, the laser working is carried out, with the result that damage to at least the photoelectric conversion layer 303 can be prevented.

Figure 3C:
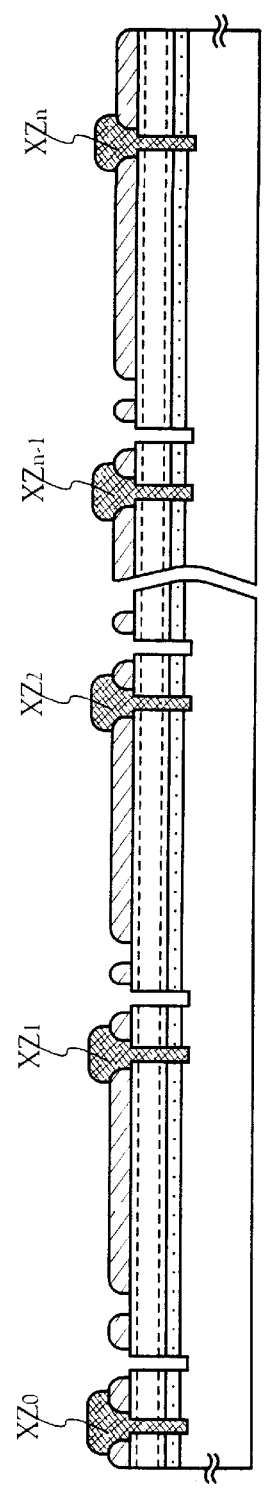

After the transparent electrode layer 302 is divided into $XT_1$ to $XT_n$, and the photoelectric conversion layer 303 is divided into $XK_1$ to $XK_n$, as shown in FIG. 3C, insulating resin layers $XZ_0$ to $XZ_n$ filling the openings $XM_0$ to $XM_n$ and covering the upper end portions are formed by the screen printing method.

Figure 4:
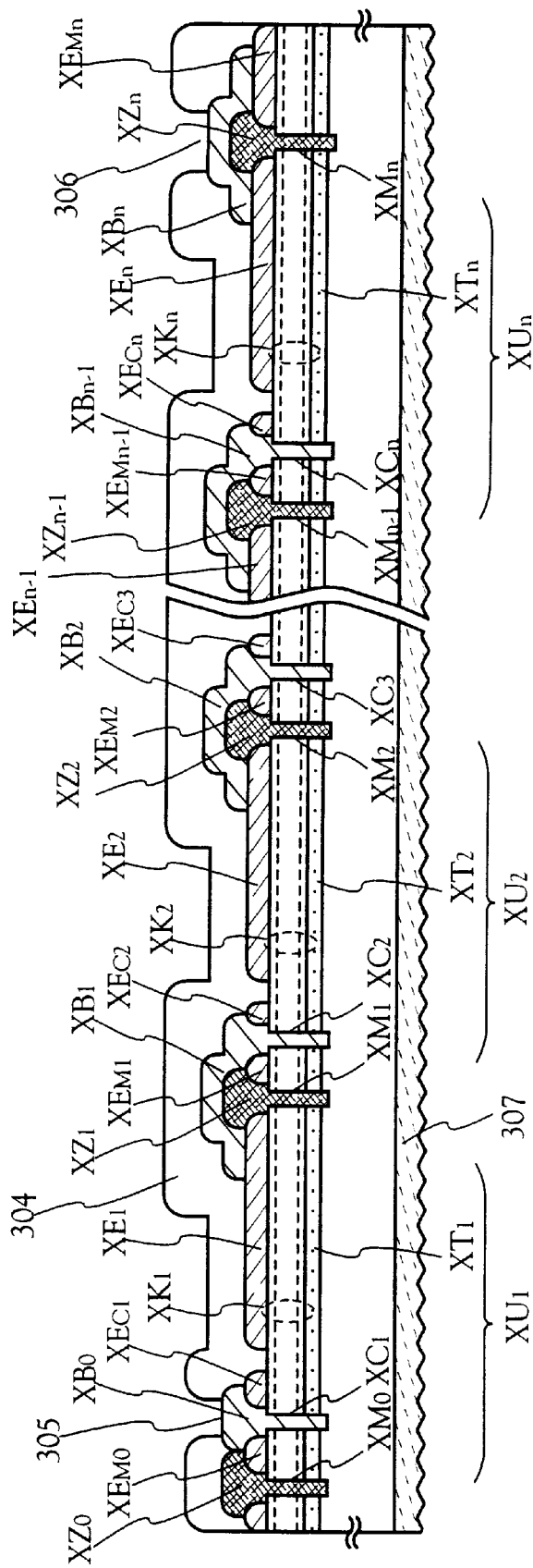
FIG. 4 is a sectional view showing a state where the solar cell is completed of Embodiment 2.

Next, as shown in FIG. 4, wiring lines $XB_0$ to $XB_{n-1}$ filling the openings $XC_1$ to $XC_n$ and connecting with the transparent electrodes $XT_1$ to $XT_n$ are formed by the screen printing method. The wiring lines $XB_0$ to $XB_{n-1}$ are formed of the same material as the rear electrode, and a thermosetting carbon paste is used. In this way, the rear electrode $E_{n-1}$ is electrically connected to the transparent electrode $T_n$.

Finally, an insulating sealing resin layer 304 is formed by a printing method. Opening portions 305 and 306 are respectively formed in the sealing resin layer 304 on the rear electrodes $E_0$ and $E_n$, and they are connected to an external circuit at these portions. In this way, a unit cell made of the transparent electrode $XT_n$, the photoelectric conversion layer $XK_n$, and the rear electrode layer $XE_n$ is formed on the substrate 301, and the adjacent rear electrode $XE_{n-1}$ is connected to the transparent electrode $XT_n$ through the opening $XC_n$, with the result that a solar cell of the n series-connected unit cells can be fabricated. The wiring line $XB_0$ is a lead-out electrode of the transparent electrode $XT_1$ of the unit cell $XU_1$.

By the surface passivation layer 107, the surface reflection can be suppressed through the phenomenon described before, and the change of the color tone at the openings and the portions of the electrode patterns resulting from integrating working can be made inconspicuous, so that the solar cell improved in external appearance quality can be fabricated. Since the surface reflection is suppressed, the amount of light incident on the photoelectric conversion layer is increased, and an effect of increasing the output of the solar cell can be obtained.

[Embodiment 3]

Figure 5:
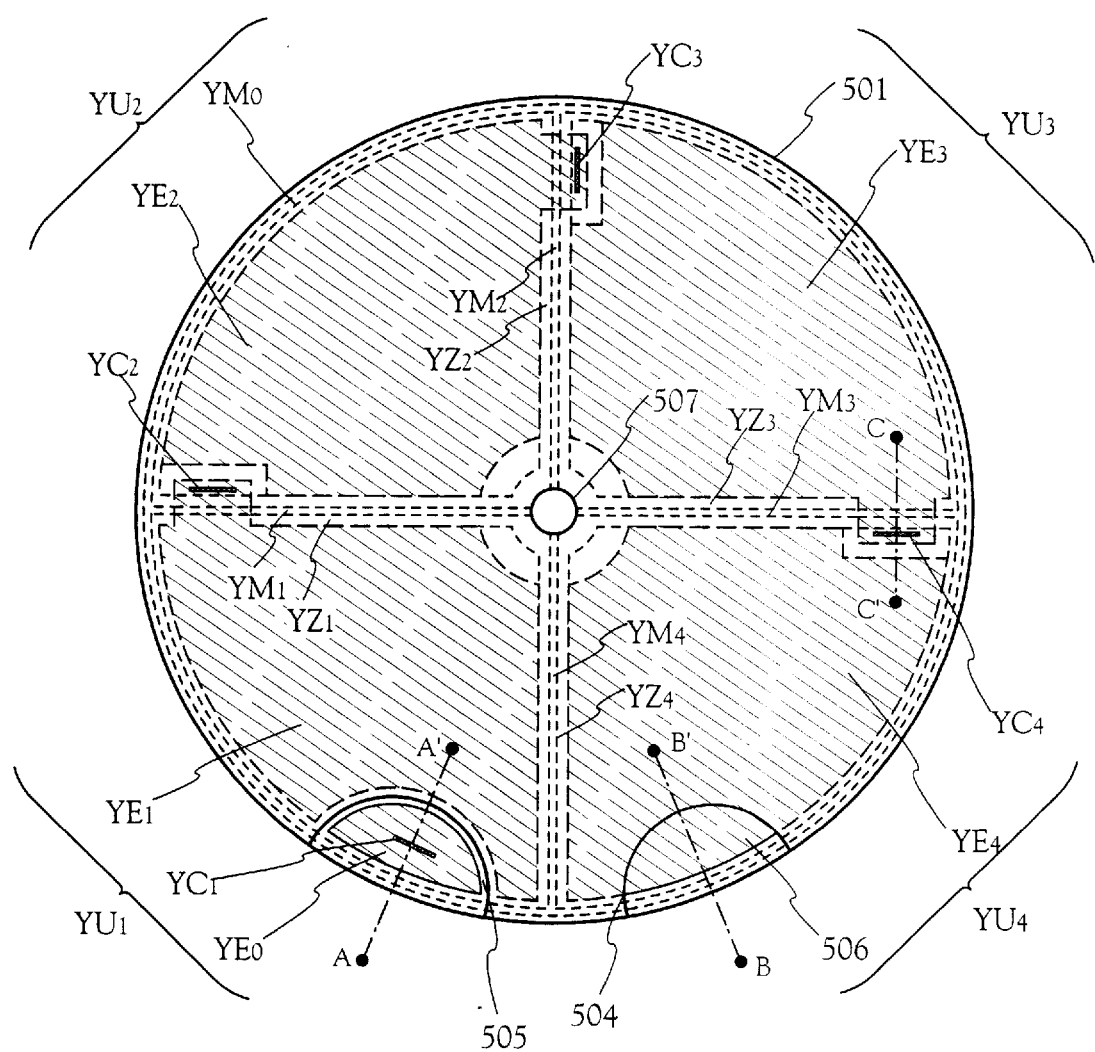
FIG. 5 is a plan view of a solar cell for a watch of Embodiment 3.

FIG. 5 is a top view of a case where a solar cell of this embodiment is seen from a rear electrode side. FIG. 5 shows an example of a solar cell arranged at the lower side (portion in which a movement of a wrist watch is installed) of a semitranslucent dial plate in the wrist watch. A substrate 501 is an organic resin film having a thickness of 70 μm, and although any of the organic resin materials set forth in the embodiment 1 can be applied, a PEN substrate is typically used. Although the shape of the substrate 501 is not limited to a circle, an insertion port 507 of a pointer shaft is provided at the center.

In the solar cell, a transparent electrode layer, a photoelectric conversion layer, a rear electrode layer, and a sealing resin layer are laminated from the side of the substrate 501. These are formed in the same manner as the embodiment 1 or the embodiment 2. Although four unit cells are concentrically arranged on the substrate 501, the structure of series connection of the solar cell is basically the same as the embodiment 1, or the structure like the embodiment 2 may be adopted.

In FIG. 5, unit cells $YU_1$ to $YU_4$ are formed by an opening $YM_0$ formed in the transparent electrode layer and the photoelectric conversion layer, and by openings $YM_1$ to $YM_4$ in the inside of the opening $YM_0$. The openings $YM_0$ to $YM_4$ are filled with insulating resin layers $YZ_0$ to $YZ_4$, and the insulating resin layers are formed so that the upper end portions of the openings $YM_0$ to $YM_4$ are covered.

Rear electrodes $YE_1$ to $YE_4$ are formed on the photoelectric conversion layer by the screen printing method using a thermosetting conductive carbon paste, and are respectively connected to transparent electrodes $YT_2$ to $YT_4$ of the adjacent unit cell through openings $YC_2$ to $YC_4$. A sealing resin layer 504 is formed on the entire surface of the rear electrodes except for connection portions 505 and 506 to the circuit substrate of the wrist watch. An output electrode $YE_0$ at the side of the transparent electrode is formed at the connection portion 505 to the circuit substrate and is connected to the transparent electrode through an opening $YC_1$. Besides, as shown in the drawing, it is formed to be separate from the rear electrode $YE_1$. The one connection portion 506 is formed to serve also as the rear electrode $YE_4$.

Figure 6A:
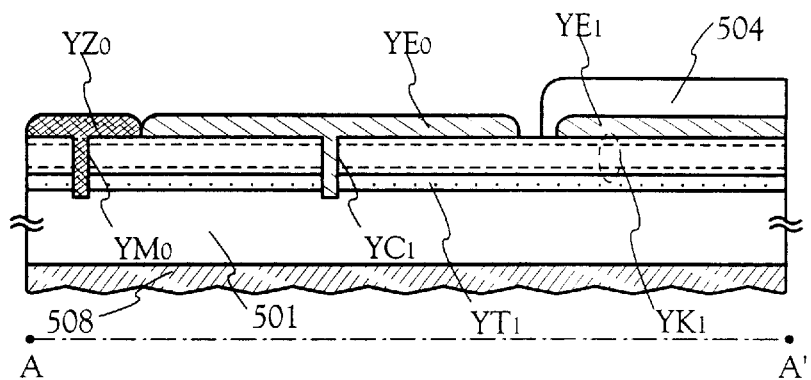
FIGS. 6A to 6C are partially sectional views of the solar cell for the watch of Embodiment 3.

FIG. 6A shows a section taken along A–A' of the periphery of the connection portion 505 to the circuit substrate in FIG. 5. The transparent electrode layer, the photoelectric conversion layer, and the rear electrode layer are formed on the substrate 501. The openings $YM_0$ and $YC_1$ are formed in the transparent electrode layer and the photoelectric conversion layer by the laser processing method, and the insulating layer $YZ_0$ is formed on the opening $YM_0$ to fill the opening and further to cover its upper end portion. The output electrode $YE_0$ at the side of the transparent electrode is connected to the transparent electrode $YT_1$ of the unit cell $YU_1$ through the opening $YC_1$. The sealing resin layer 504 is formed on the rear electrode $YE_1$ of the unit cell $YU_1$. Further, at the light incident side of the substrate 501, a surface passivation layer 508 is formed. Thus, the surface reflection is lowered, and the color tone change at the openings and the portions between electrode patterns, resulting from integrating working can be inconspicuous.

Figure 6B:
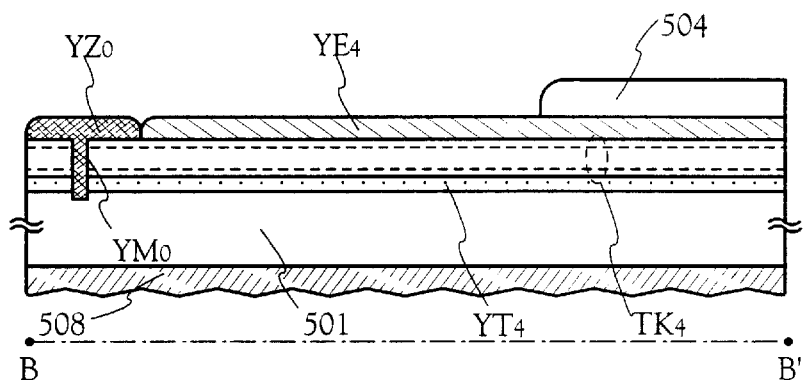

Similarly, FIG. 6B shows a section taken along B–B' of the periphery of the connection portion 506 to the external circuit, and the transparent electrode $YT_4$, the photoelectric conversion layer $YK_4$, and the rear electrode layer $YE_4$ are formed on the substrate 501. The surface passivation layer 508 is formed on the light incident side of the substrate 501. The transparent electrode $YT_4$ is formed at the inside of the end portion by the opening $YM_0$, and the insulating layer $YZ_0$ fills the opening and further covers its upper end portion. Although the sealing resin layer is formed on the rear electrode layer $YE_4$, it is not formed on the connection portion 506.

Figure 6C:
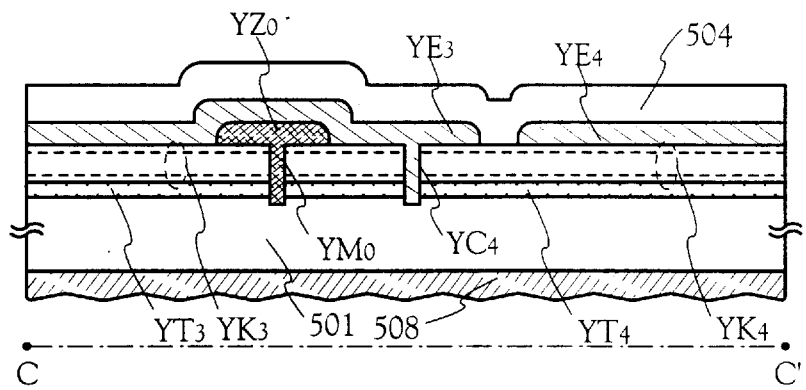

FIG. 6C shows a section taken along C–C' of the connection portion of the adjacent unit cells in FIG. 5. The transparent electrodes $YT_3$ and $YT_4$ are formed on the substrate 501, and are insulated and separated from each other by the opening $YM_0$ and the insulating layer $YZ_0$ formed to cover the opening and its upper end portion. Similarly, the photoelectric conversion layers $YK_3$ and $YK_4$ are also separated. With respect to the connection between the unit cells $YU_3$ and $YU_4$, a conductive material is filled in the opening $YC_4$, and the rear electrode $YE_3$ is connected to the transparent electrode $YT_4$. The surface passivation layer 508 is formed on the light incident side of the substrate 501.

Figure 7:
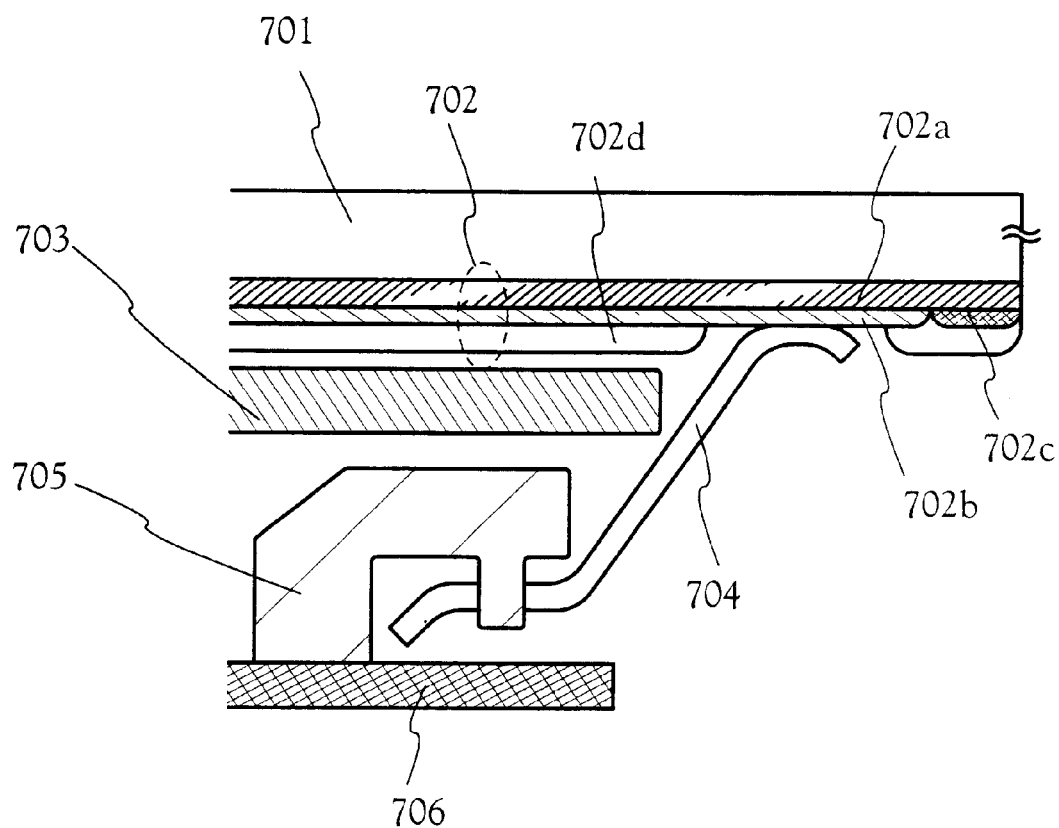
FIG. 7 is a view for explaining connection between an output terminal of a solar cell and a circuit substrate of an electric instrument of Embodiment 3.

In the manner as described above, it is possible to form the solar cell in which the four unit cells $YU_1$ to $YU_4$ are connected in series. In solar cells installed in various electric instruments such as a calculator or a watch, with respect to connection to a circuit in the electric instrument, there is adopted a method of direct connection using a coil spring or a plate spring, in addition to a connecting method using soldering or a thermosetting adhesive. FIG. 7 is a view for explaining an example of such a connection method, and shows a state where connection between a solar cell and a circuit substrate is made through a connection spring. The structure of the solar cell is simply shown, and the drawing shows the state where a rear electrode 702b, an insulating resin 702c, and a sealing resin 702d of a photoelectric conversion device 702 are formed on a substrate 702a. In addition, a stainless structural body 703, a support body 701 and the like are included. A connection spring 704 is in contact with the rear electrode at an opening portion of the sealing resin 702d, and electrical connection is formed to a circuit substrate 706 through a terminal portion 705. The connection structure of a pressure contact type using mechanical force like this does not give severe damage to the solar cell as compared with a connection method such as soldering or heat sealing, and does not cause yield to be lowered in a manufacturing process as well. However, when the rear electrode is formed of metal material, the surface is oxidized by aging, with the result that contact resistance is increased. However, in the case where the carbon paste is used, such a problem does not occur.

When the solar cell fabricated in this way is set at the lower side of a semitranslucent face of a wrist watch, by the effect of the foregoing, surface passivation layer, at the openings and the portions between the electrode patterns resulting from integrating working, the change of the color tone becomes inconspicuous, and the external appearance quality of the wrist watch can be raised. In the case where oligomer is discharged from the PEN film base material, since it is fixed in the surface passivation layer, the wrist watch incorporating the solar cell is not polluted by the oligomer.

As described above, according to the present invention, when the solar cell is set at the lower side of a semitranslucent dial plate in a wrist watch, by the effect of the foregoing surface passivation layer, at the openings and the portions between the electrode patterns resulting from integrating working, the change of the color tone becomes inconspicuous, and the external appearance quality of the wrist watch can be raised. Besides, even in the case where oligomer is discharged from a base material nearest a light receiving surface, since it is fixed in the surface passivation layer, the wrist watch incorporating the solar cell is not polluted by the oligomer. Further, surface reflection is lowered by the uneven shape of the surface passivation layer, and the light confinement effect by fillers is also obtained, so that the amount of light incident on the photoelectric conversion layer is increased, and the photoelectric conversion efficiency of the solar cell can be raised.

What is claimed is:

1. A solar cell comprising:
   a transparent electrode layer formed over a first surface of a transparent organic resin substrate;
   a photoelectric conversion layer formed over the first surface;
   a rear electrode layer formed over the first surface;
   a surface passivation layer comprising an organic resin layer and formed over a second surface of the substrate, said second surface opposing the first surface,
   wherein the surface passivation layer includes at least one selected from the group consisting of a white filler and a colorless filler,
   wherein a light is entered from the second surface of the substrate,
   wherein the rear electrode layer is formed by hardening a carbon paste.

2. A solar cell comprising:
   a transparent electrode layer formed over a first surface of a transparent organic resin substrate;
   a photoelectric conversion layer formed over the first surface;
   a rear electrode layer formed over the first surface;
   a first opening filled with an insulating resin and being formed in the transparent electrode layer and the photoelectric conversion layer;

a second opening filled with a same conductive material as the rear electrode layer and being formed in the transparent electrode layer and the photoelectric conversion layer;

a surface passivation layer comprising an organic resin layer and formed on a second surface of the organic resin substrate, said second surface opposing the first surface, wherein the surface passivation layer includes at least one selected from the group consisting of a white filler and a colorless filler, wherein a light is entered from the second surface of the substrate, wherein the rear electrode layer is formed by hardening a carbon paste.

3. A solar cell according to claim 1, wherein the surface passivation layer comprises at least one selected from the group consisting of phenoxy resin and thermally hardened resin of the phenoxy resin.

4. A solar cell according to claim 3, wherein nonaromatic isocyanate or melamine resin making a thermal crosslinking reaction with a hydroxyl group of the phenoxy resin is used as a crosslinking agent so as to thermally harden the phenoxy resin.

5. A method of fabricating a solar cell, said method comprising the steps of:

forming a transparent electrode layer over a first surface of a transparent organic resin substrate;

forming a photoelectric conversion layer on the transparent electrode layer;

forming a first opening and a second opening reaching the substrate in the transparent electrode layer and the photoelectric conversion layer;

forming an insulating layer covering the first opening and an upper end portion of the first opening;

forming a conductive layer covering the photoelectric conversion layer, the insulating layer, the second opening and an upper end portion of the second opening; and forming an insulating sealing resin layer on the photoelectric conversion layer and the conductive layer, wherein a step of forming a surface passivation layer over a second surface opposing the first surface is performed after the step of forming the photoelectric conversion layer, wherein a light is entered from the second surface of the substrate, wherein the conductive layer is formed by hardening a carbon paste.

6. A method of fabricating a solar cell, comprising:

forming a transparent electrode layer over a first surface of a transparent organic resin substrate;

forming a photoelectric conversion layer on the transparent electrode layer;

forming a first conductive layer of a pattern on the photoelectric conversion layer;

forming a first opening and a second opening reaching the substrate in the transparent electrode layer and the photoelectric conversion layer;

forming an insulating layer covering the first opening and an upper end portion of the first opening;

forming a second conductive layer covering the photoelectric conversion layer, the insulating layer, the second opening and an upper end portion of the second opening; and forming an insulating sealing resin layer on the photoelectric conversion layer and the second conductive layer, wherein a step of forming a surface passivation layer over a second surface opposing the first surface is performed after the step of forming the photoelectric conversion layer, wherein a light is entered from the second surface of the substrate, wherein the second conductive layer is formed by hardening a carbon paste.

7. A method according to claim 5, wherein the surface passivation layer includes a filler in addition to at least one selected from the group consisting of phenoxy resin and thermosetting phenoxy resin as a matrix resin component, wherein the surface passivation layer has an optical diffusibility in addition to an optical transparency.

8. A solar cell according to claim 2, wherein the surface passivation layer comprises at least one selected from the group consisting of phenoxy resin and thermally hardened resin of the phenoxy resin.

9. A solar cell according to claim 8, wherein nonaromatic isocyanate or melamine resin making a thermal crosslinking reaction with a hydroxyl group of the phenoxy resin is used as a crosslinking agent so as to thermally harden the phenoxy resin.

10. A method according to claim 6, wherein the surface passivation layer includes a filler in addition to at least one selected from the group consisting of phenoxy resin and thermosetting phenoxy resin as a matrix resin component, p1 wherein the surface passivation layer has an optical diffusibility in addition to an optical transparency.

11. A method according to claim 7, wherein nonaromatic isocyanate or melamine resin making a thermal crosslinking reaction with a hydroxyl group of the phenoxy resin is used as a crosslinking agent so as to thermally harden the phenoxy resin.

12. A method according to claim 10, wherein nonaromatic isocyanate or melamine resin making a thermal crosslinking reaction with a hydroxyl group of the phenoxy resin is used as a crosslinking agent so as to thermally harden the phenoxy resin.

* * * * *